United States Patent [19]

Hampton et al.

[11] 4,167,174

[45] Sep. 11, 1979

[54] METHOD AND APPARATUS FOR ALIGNING THE STREETS OF A SEMICONDUCTOR WAFER

[75] Inventors: Gordon P. Hampton, Cupertino; Matheus D. Pennings, Los Altos, both of Calif.

[73] Assignee: General Signal Corporation, Stamford, Conn.

[21] Appl. No.: 858,719

[22] Filed: Dec. 8, 1977

[51] Int. Cl.² .............................................. B28D 1/04
[52] U.S. Cl. .................................. 125/13 R; 33/1 M; 51/165.72; 125/21
[58] Field of Search ...................... 33/1 M; 51/165.72; 125/12, 13, 14, 16 R, 21

[56] References Cited

U.S. PATENT DOCUMENTS

| 2,941,136 | 6/1960 | Marantette | 33/1 M |
| 3,674,004 | 7/1972 | Grandia | 125/16 R |
| 3,691,864 | 9/1972 | Cochran | 33/1 M |
| 3,876,301 | 4/1975 | Kosugi | 33/1 M |

*Primary Examiner*—Harold D. Whitehead
*Attorney, Agent, or Firm*—Blakely, Sokoloff, Taylor & Zafman

[57] ABSTRACT

A method and apparatus for aligning the streets of a semiconductor wafer for sawing or scribing with a single motion control switch. One end of a street is first aligned with a reticle in the Y-direction with this motion control switch. The wafer is then moved in the X-direction while the operator with the same control switch, controls the rotation of the wafer so as to align the street with the reticle. Automatic Y-direction alignment is provided during this rotation by determining the Y-direction misalignment which occurs from the rotation, and by automatically moving the wafer saw blade assembly in the Y-direction to provide the necessary compensation.

10 Claims, 8 Drawing Figures

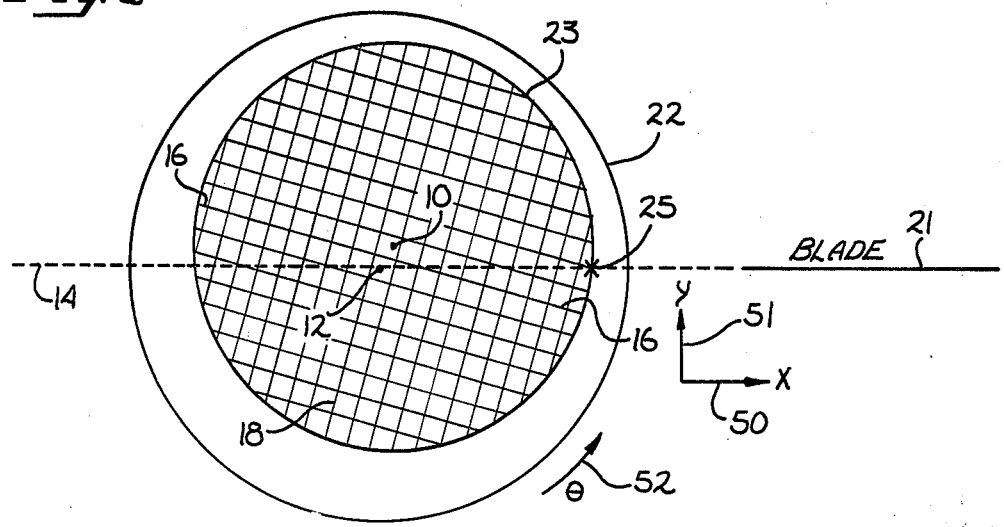
Fig. 1
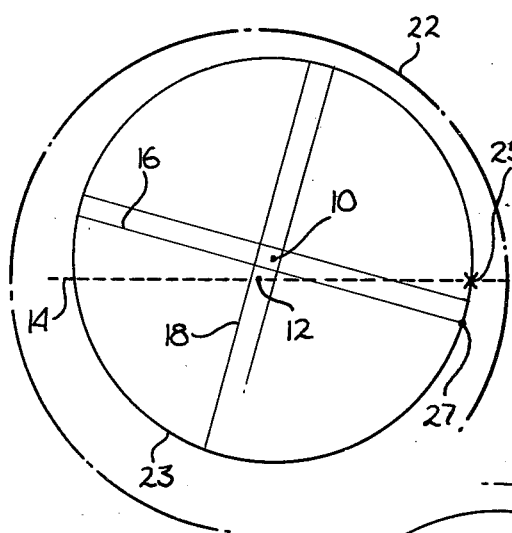
Fig. 2
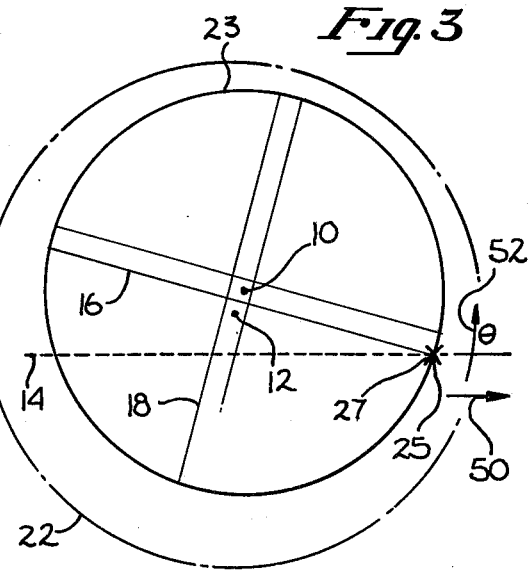
Fig. 3
Fig. 4

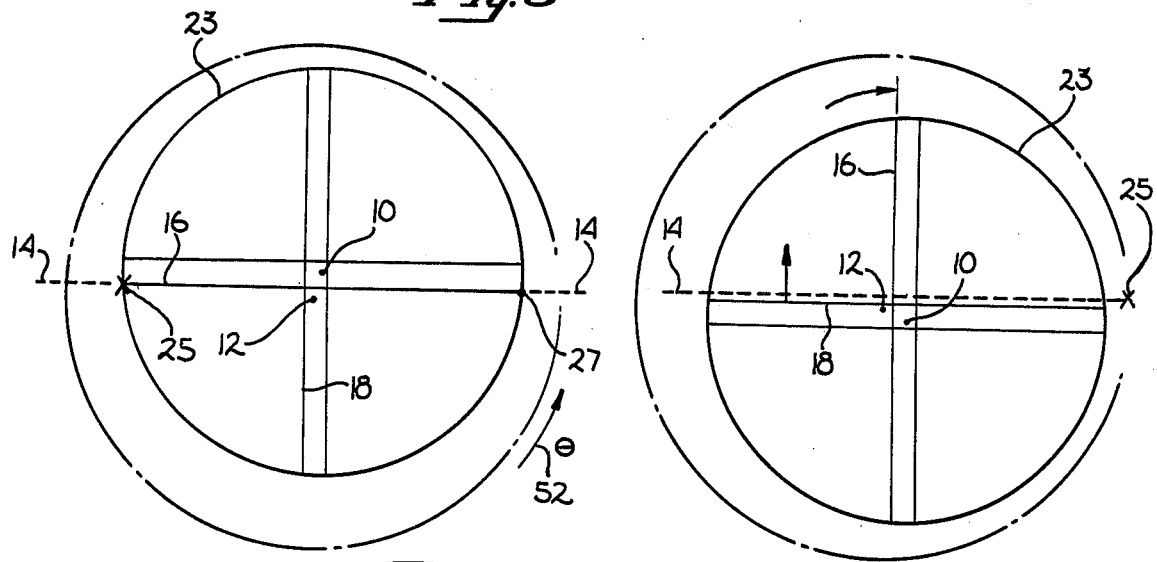
Fig. 5
Fig. 6
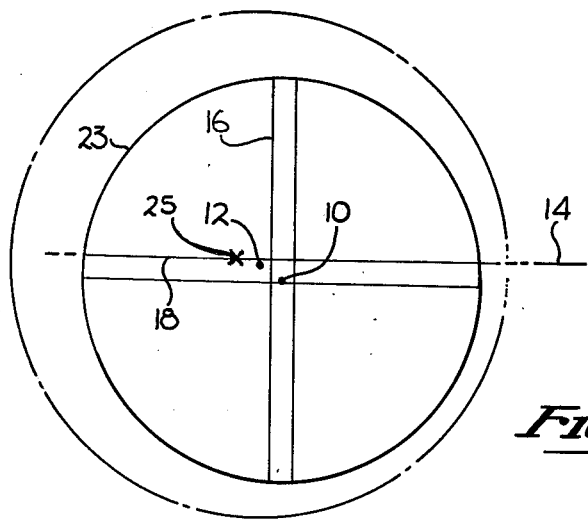
Fig. 7

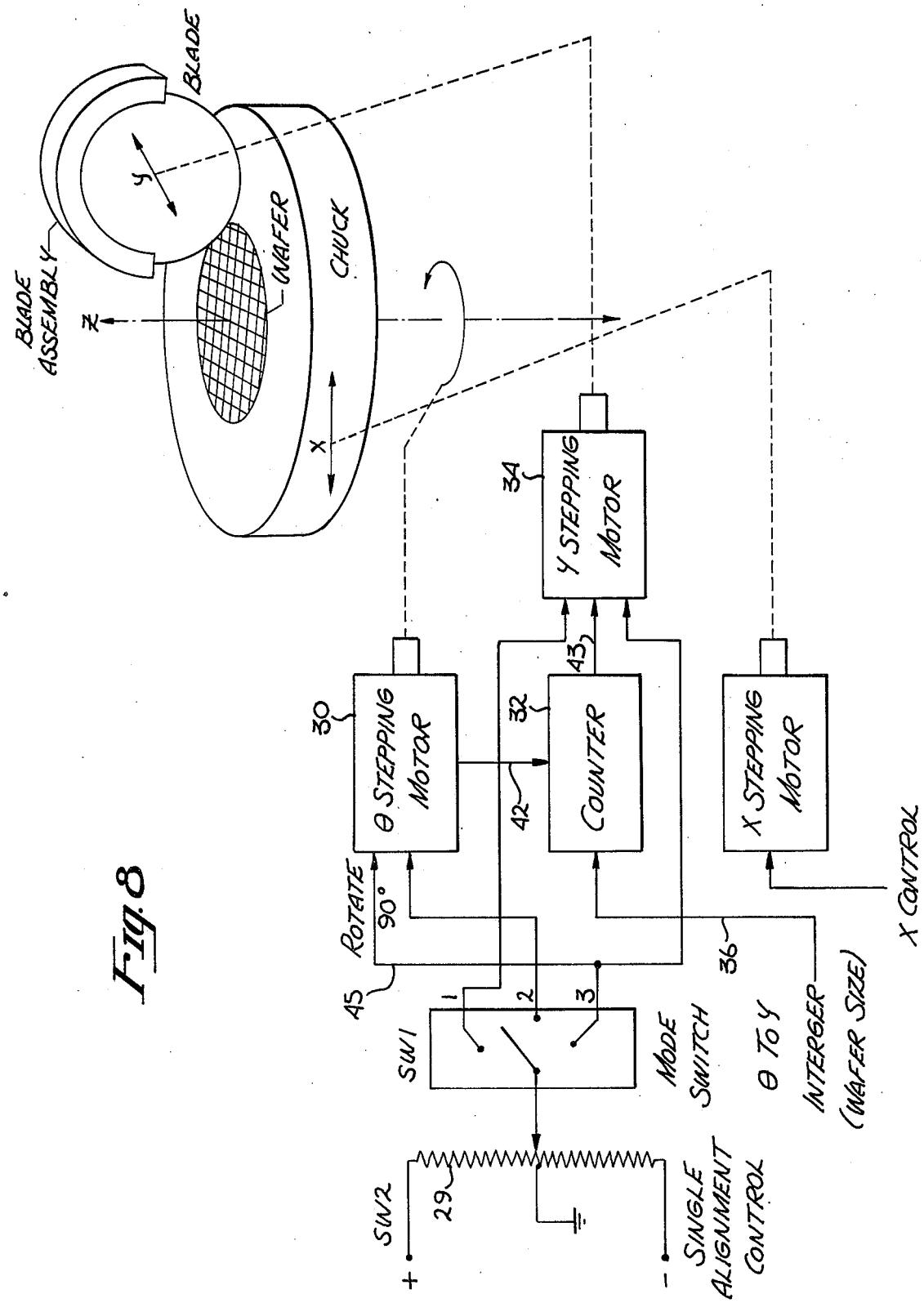

METHOD AND APPARATUS FOR ALIGNING THE STREETS OF A SEMICONDUCTOR WAFER

BACKGROUND OF THE INVENTION

1. Field of the Invention

The invention relates to the field of aligning the streets of a semiconductor wafer for sawing, scribing or other operations.

2. Prior Art

During the fabrication of integrated circuits, most often a plurality of identical circuits are simultaneously formed on a circular semiconductor wafer. The circuits are separated from one another by "streets"; the streets generally form an orthogonal grid on the wafer. After fabrication, the circuits are separated into "chips" at the streets by sawing the wafer or by scribing the wafer and breaking it into chips.

When a wafer saw or similar tool is employed to saw or scribe the wafer, the wafer is first secured on a working surface such as a vacuum chuck. In the case of a wafer saw, the saw blade typically moves only in the Y-direction and the chuck is moved in the X-direction to saw the wafer. Before the wafer can be cut, it must first be aligned with the blade.

In most wafer saws, the vacuum chuck moves in the X, Z and θ-directions and the blade and microscope assembly (hereinafter referred to as the "blade assembly") moves in the Y-direction. The operator generally manipulates the Y- and θ-direction controls to align a street with a cutting path. Since the exact position of the wafer on the chuck is unknown, this alignment is time consuming. Specifically, since the center of rotation of the chuck is not aligned with the center of the street grid, rotation of the chuck results in a translation of the streets as well as rotation.

In one commonly employed method, a street is aligned with the cutting path by movement in the θ- and Y-directions. The operator first controls the rotational movement of the wafer chuck. However, since a street may not be in line with the reticle of the microscope, the operator must move the blade assembly in the Y-direction, and then return to the rotational control to obtain this parallelism. Typically, the operator must alternate between the θ and Y-direction controls a number of times to align a single street with the cutting path since rotation of the chuck results in a translation of the street.

In another method, the alignment procedure begins with the reticle in the center of the chuck. In still another method, a split field microscope is employed. In both these latter methods, the operator must coordinate both the rotational and Y-direction movement in order to align the wafer.

As will be seen with the present invention, the operator need only control a single aligning, motion control switch and need not alternate between a Y-direction motion control switch and a rotational motion control switch to align the streets of the wafer.

SUMMARY OF THE INVENTION

A method and apparatus for aligning the streets of a wafer is described. In the method, first one end of a street is moved under a reticle. This is accomplished by relative movement in the Y-direction through the use of the single alignment control switch. The wafer is then moved in the X-direction. While this occurs the operator through use of the same control switch maintains the reticle on the street. The control switch during this movement in the X-direction directly controls the rotational movement of the chuck. In the presently preferred embodiment, a counter is employed to count the number of steps through which the θ-direction stepping motor rotates. Each time this counter reaches a predetermined count, relative movement between the blade and wafer occurs in the Y-direction. In this manner, even though the operator is rotating the wafer, the street with be aligned with the cutting path.

In the presently preferred embodiment, after a first street has been aligned in the above-described manner, the wafer is rotated exactly 90° and another Y-alignment is made. The saw is then able to automatically saw or scribe transverse streets without the necessity of a second alignment after first parallel streets have been sawed or scribed.

BRIEF DESCRIPTION OF THE DRAWINGS

FIG. 1 is a plan view illustrating a wafer mounted on a chuck of a wafer saw.

FIG. 2 illustrates the wafer of FIG. 1, and more particularly a few streets of that wafer and their relative position with respect to a reticle and a cutting path.

FIG. 3 illustrates the wafer of FIG. 2 after one end of a street has been aligned with the reticle by movement in the Y-direction.

FIG. 4 illustrates the wafer of FIG. 3 after the wafer has been moved in the X-direction; this view shows a misalignment which requires correcting.

FIG. 5 illustrates the wafer of FIG. 4 with the reticle at the other end of the street and with the street aligned with the cutting path.

FIG. 6 illustrates the wafer of FIG. 5 after the wafer has been rotated 90°.

FIG. 7 illustrates the wafer of FIG. 6 after a second street has been aligned in the Y-direction with the cutting path.

FIG. 8 is a block diagram which illustrates the alignment control or switch and its coupling with stepping motors and a counter.

DETAILED DESCRIPTION OF THE INVENTION

A method and apparatus for aligning the streets of a semiconductor wafer is described. The following description is oriented towards the aligning of such a wafer on a wafer saw. However, it will be obvious to one skilled in the art that the disclosed method and apparatus may be employed for aligning a wafer for operations other than cutting or scribing the wafer, such as for probing.

It will be apparent to one skilled in the art that the described alignment technique may be employed with a plurality of different wafer saws. Since these saws are well-known, one is not illustrated in the present description. Typically, these saws include a cutting table such as a vacuum chuck. Through use of a plurality of stepping motors, the chuck is driven in the linear X-, and Z-directions and the chuck is rotated (θ-direction). The blade assembly moves in the Y-direction. In general with these saws, after a wafer has been placed on the chuck and secured thereon, a first street is aligned with the cutting path of the blade. Once this alignment occurs, all the streets parallel to this first street may then be automatically sawed. Since the streets are parallel and since they are separated by a constant, known distance, only one street is aligned before cutting all streets parallel to the aligned street. Next, the chuck is rotated 90° and a street transverse to the cut streets, is aligned with the cutting path. In a similar manner, all the remaining parallel streets on the wafer are sawed.

Most often, a microscope having a reticle in alignment with the cutting blade and fixed for movement in the Y-direction with the blade is employed to align the wafer. During this alignment, the vacuum chuck is lowered (Z-direction) in order that it may be freely moved under the blade.

In the following description, the term "cutting path" is employed to designate the path defined by the blade in the wafer when relative movement occurs between the wafer and the blade. As mentioned, most typically this relative motion occurs by the movement of the chuck in the X-direction while the blade remains fixed about its center of rotation. Also in the following description and the drawing the wafer is shown and discussed as moving in the Y-direction in order that the invention be more readily understood. As mentioned, most often the blade assembly moves relative to the wafer in the Y-direction. It will be obvious to one skilled in the art that the X-, Y-, Z- and $\theta$-direction movement is relative movement, that is, movement that changes the orientation between the blade assembly and wafer. Thus the invented method and apparatus will work equally well where, for example, the blade assembly moves in the X-direction and the chuck in the Y-direction.

Referring first to FIG. 1, a circular wafer 23, having a center 10, is secured to a chuck 22. The center of rotation of the chuck 22 is shown as axis 12. As previously mentioned, when the wafer 23 is placed on the chuck 22, its location on the chuck is not known. This has been illustrated in FIG. 1 by the fact that the wafer's center 10 is not coincident with the axis 12 of the chuck 22. The wafer 23 includes a first plurality of parallel streets such as street 16. Each of these streets are separated, one from the other, by a constant, known distance. The wafer includes a second plurality of parallel streets which are transverse to the first plurality of parallel streets. One such street 18 is identified in FIG. 1.

Relative motion between the chuck 22 and blade assembly occurs in three linear directions, each orthogonal to one another. The X-direction is shown by arrow 50 and the Y-direction by arrow 51 (the Z-direction is not shown). The rotation of the chuck 22 is shown by the $\theta$-direction arrow 52. In the following description, it will be assumed that the chuck 22 may be moved in the $\theta$, X- and Y-directions without contacting the blade 21. The path of the blade 21 across the wafer 23 when cutting does occur is shown by the cutting path 14.

In the following description, the reticle 25 as viewed by the operator is shown on the wafer. In the presently preferred embodiment, the reticle 25 is in alignment with the blade 21.

Also, in the following description, the alignment of streets 16 and 18 will be described. It will be apparent that once this alignment is achieved, all the streets on the wafer may be sawed or scribed in a well-known manner.

Referring now to FIG. 2, after the wafer 23 has been secured on the chuck, a first alignment is made to align one end of the street 16 (point 27) with the reticle 25. In order to do this, the wafer is moved in the Y-direction, and more specifically, for street 16 of FIG. 2, the wafer is moved in the positive Y-direction. The alignment of one end of the street 16 with the reticle 25 is shown in FIG. 3 by the coincidence of point 27 and reticle 25.

Now the chuck is moved in the positive X-direction, as indicated by arrow 50 in FIG. 3. (The switching to accomplish this movement and the alignments shall be discussed later.) As the wafer moves to the right, the operator controls the rotating of the wafer 23 so as to drive the street 16 toward the reticle. In FIG. 4, the reticle is illustrated in the central region of the wafer 23. For the illustrated example, the wafer 23 is rotated in the positive $\theta$-direction toward the reticle. As will be explained in greater detail, the wafer is automatically moved in the negative Y-direction along with the rotation. Thus, as best indicated in FIG. 4, point 27 moves upwardly as rotation occurs about axis 12. Then the automatic Y compensation moves the wafer in the negative Y-direction to continually bring point 25 back to path 14. This combination of rotation and translation, in effect, causes the wafer to rotate about point 27.

Finally, as shown in FIG. 5, the operator continues to align the street 16 with the reticle 25. As the reticle moves across the wafer, complete coincidence occurs between the street 16 and the cutting path 14. It is the automatic compensation in the Y-direction which causes the alignment between the street and the cutting path since the operator controls only the rotational movement.

The needed Y-compensation may be computed from the equation $Y = X \tan \theta$. In the presently preferred embodiment, the necessary Y-direction compensation is accumulated in a counter until it amounts to the equivalent of a single step of the stepping motor which drives the blade assembly in the Y-direction. Then, the counter is cleared as the Y-stepping motor steps in either the positive or the negative Y-direction. In the presently preferred embodiment, an instantaneous computation of the Y-compensation is unnecessary since the total travel in the X-direction is limited to predetermined distances which result in a Y-direction step for each one, two or three $\theta$-direction steps. Specifically, each step of the $\theta$-direction stepping motor rotates the chuck 1/400 of a degree. Each step of the Y-direction stepping motor moves the blade assembly 0.1 mils. If it is assumed that $\tan \theta = \theta$ for small angles and other simplifying approximations are made, three steps of the $\theta$-stepping motor requires one step of the Y-stepping motor if the X-travel is limited to 1.527". For 2" wafers, the travel in the X-direction is controlled to this distance. Thus, a Y-direction correction (step) occurs for each three steps of the $\theta$-stepping motor. For 3" and 4" wafers, the X-direction movement is limited to 2.29". For this distance, two steps of the $\theta$-stepping motor requires one step of the Y-stepping for compensation. For 5" and 6" wafers, the X-distance travel is 4.58". In this case, for each step of the $\theta$-stepping motor, the Y-stepping motor takes one step.

The implementation of the automatic Y-direction compensation is illustrated in FIG. 8. A switch 29 (SW2) is the motion control switch which the operator manipulates during alignment to perform all manual motion control. The result appears to be the same to the operator whether there is just Y-direction movement or combined $\theta$- and Y-movement. If the street, for example, is above the reticle, the operator moves the switch down and in the limited field of view of the operator it cannot be discerned if just Y-direction movement occurs or if both $\theta$- and Y-movement occurs. This switch may be moved so as to cause the θ-stepping motor 30 to rotate in either the positive θ-direction or the negative θ-direction. The harder the switch is pushed in either direction, the faster the motor rotates. The stepping motor 30 communicates a signal to a counter 32 (line 42) each time the motor rotates through a step. The counter 32, as will be described, may be a 3-bit counter. Counter 32 provides a signal to the Y-stepping motor 34 (line 43) to cause this motor to step in either the positive direction or in the negative direction. A signal is supplied to counter 32 on line 36 to indicate the θ to Y ratio, that is, 1, 2 or 3. In practice, the operator indicates only the wafer size to select the appropriate ratio.

Assume that a two-inch wafer has been placed on the chuck and the operator has made an appropriate selection to indicate the wafer size. The θ to Y ratio is 3, as previously discussed. The signal on line 36 causes the counter 32 to provide an output signal for every three steps of the stepping motor 30. Moreover, an appropriate signal is coupled to the X-stepping motor to limit the X-direction travel to 1.527". A logic circuit is employed within the counter 32 to indicate whether the steps taken by the θ-stepping motor are positive steps or negative steps. This circuit assures that the Y-stepping motor turns in the appropriate direction so as to provide the required Y-direction compensation. Thus, by employing a relatively simple counter 32 and by controlling the X-distance travel, the automatic Y-direction compensation is provided without requiring a numerical computation.

As is apparent from FIG. 5, once the street 16 is aligned with the cutting path 14, all the streets parallel to street 16 may be cut or scribed. However, in the presently preferred embodiment, before any cutting or scribing occurs, a street transverse to street 16 is aligned. After the completion of the alignment shown in FIG. 5, the wafer saw records the Y position which provided the alignment shown in FIG. 5. Then, the wafer is rotated exactly 90° to the position shown in FIG. 6. Since street 18 is perpendicular to street 16, street 18 will be parallel to the cutting path 14. The operator, through use of switch SW2 (FIG. 8), makes an alignment in the Y-direction to align the street 18 with the cutting path 14, assuming the mode switch SW1 is in position 3. (For this alignment and the initial Y-direction alignment of FIG. 3, switch SW2 controls the Y-stepping motor.) Once this alignment is completed (FIG. 7), all the streets of the wafer may then be automatically cut. That is, street 18 and all the parallel streets may first be cut and then the wafer may be automatically rotated and returned to the Y-position previously recorded, to the position of FIG. 5 so that street 16 and all the streets parallel to street 16 may be cut. Note that rather than returning to this Y-position, the apparatus may calculate the distance to the edge of the wafer. Cutting then may begin at the edge of the wafer parallel to street 16.

As presently implemented, a three-position mode switch, SW1 (FIG. 8), is employed to select the alignment modes. When this switch is in its first position, movement of the SW2 switch (FIG. 8) causes the blade assembly to move in the Y-direction. This allows the alignment shown in FIG. 3 to be made. Then, the switch SW1 is moved to its second position, the alignment shown in FIGS. 4 and 5 is made since the switch SW2 now controls the θ-stepping motor. Also, when the SW1 is moved into the second position the X-stepping motor automatically drives the chuck in the X-direction for the predetermined distance. When the switch SW1 is moved to its third position, the chuck is rotated 90° (line 45, FIG. 8) to the position indicated in FIG. 6 and the switch SW2 again controls Y-direction movement to allow the alignment shown in FIG. 7. Thus, the operator need only manipulate the switch SW2 for making all the alignment motions and switch SW1 for selecting the mode of operation.

While in the presently preferred embodiment the operator controls θ-direction movement for the alignment shown in FIGS. 4 and 5, during this alignment the operator could control Y-direction movement where automatic θ-direction compensation is provided. Moreover, while in the presently preferred embodiment the first Y-direction alignment is made at the end of a street, this alignment could be made at the center of the wafer. The wafer would then be moved in the X-direction, for example, one-half the distance discussed above.

In an alternate method the first Y-direction alignment shown in FIG. 3 is made. Then the wafer is moved in the X-direction a predetermined distance. A second Y-direction alignment is next made at the other end of street 16. The number of steps through which the Y-direction stepping motor turns is noted and used to determine the necessary θ-direction compensation and translation in the Y-direction to move the street to the reticle. The necessary θ- and Y-direction compensation is then made aligning the street with the cutting path. In this alternate method, care must be taken to assure that for the second Y-direction alignment, the same street which was aligned in the first Y-direction alignment is again aligned.

Thus, a method and apparatus has been described for aligning a wafer on a wafer saw or other device. During all the alignment steps, the operator need only move a single motion control switch and make a selection on a second switch. Unlike prior art aligning methods, the operator need not alternate between two motion control switches to align the streets of the wafer. Instead, the operator selects a mode while automatically performing the correct motion as the operator seeks to align the street with the reticle. The limited area of view in the microscope gives the impression that movement is only occuring in the Y-direction.

We claim:
1. A method for aligning a street of a wafer comprising the steps of:
  aligning a first street with a fixed reference by relative movement in a first linear direction;
  aligning said first street with said reference as said street is moved relative to said fixed reference in a second linear direction by manually controlling the rotation of said wafer;
  automatically controlling the relative movement in said first direction in response to said rotation of said wafer;
  whereby said street is aligned.
2. The method defined by claim 1 wherein said wafer is moved a predetermined distance in said first direction each time said rotation is at least equal to a predetermined angle.
3. The method defined by claim 1 including the additional steps of:
  rotating said wafer 90°;
  aligning a second street which is transverse to said first street with said fixed reference by relative movement in said first linear direction.

4. In a wafer saw which includes a chuck to which a wafer is secured, said chuck movable in the X-direction, said X-direction being in alignment with the cutting direction of the saw blade, a blade assembly movable in the Y-direction which is perpendicular to said X-direction and said chuck rotatable in the $\theta$-direction, and said saw including a microscope with an aligning reticle which moves with said blade assembly; a method for aligning a street of a wafer secured to said chuck with said blade comprising the steps of:

(a) manually aligning a point on said street with said reticle; and (b) providing coordinated movement of said chuck in said $\theta$-direction and said Y-direction while moving said chuck in said X-direction so as to effectively rotate said wafer about said point;

whereby said street is aligned with said blade.

5. The method defined by claim 4 wherein said movement in said Y-direction set forth in step (b) occurs each time said rotation set forth in step (b) is equal to or greater than a predetermined angle.

6. The method defined by claim 5 wherein said movement in said X-direction set forth in step (b) is limited to a predetermined distance.

7. The method defined by claim 4 including the steps of:

(c) rotating said chuck 90° in said $\theta$-direction;

(d) aligning a second street with said reticle by manually moving said blade assembly in said Y-direction.

8. A method for aligning a street of a wafer on a wafer saw comprising the steps of:

aligning a first point on said street with the cutting path;

moving said wafer a predetermined distance in a direction parallel to the cutting path;

manually aligning a second point spaced apart from said first point on said street with said cutting path;

automatically rotating and translating said wafer through a predetermined angle and translation, as a function of the distance moved to align said second point;

whereby said street is aligned with said cutting path.

9. A wafer saw including:

a Y-direction stepping motor for moving a blade relative to said wafer in a direction transverse to the cutting path of said blade;

a $\theta$-direction stepping motor for rotation of said wafer;

a counter means for counting the steps through which said $\theta$-direction stepping motor turns, said counter means coupled to said $\theta$-direction stepping motor, said counter means for initiating movement for said Y-direction stepping motor each time the count in said counter means reaches a predetermined count;

whereby during the alignment of the streets of said wafer on said saw automatic Y-direction compensation is provided.

10. The apparatus defined by claim 9 including a switch for controlling movement in said Y-direction during alignment in said Y-direction and for controlling rotational movement in said $\theta$-direction during alignment in said $\theta$-direction.

* * * * *